United States Patent [19]
Yagi et al.

[11] Patent Number: 6,074,202
[45] Date of Patent: Jun. 13, 2000

[54] APPARATUS FOR MANUFACTURING A SEMICONDUCTOR MATERIAL

[75] Inventors: Shin-Ichiro Yagi; Yutaka Ota, both of Annaka, Japan

[73] Assignee: Shin Etsu Handotai, Co., Ltd., Tokyo, Japan

[21] Appl. No.: 09/218,014

[22] Filed: Dec. 22, 1998

[30] Foreign Application Priority Data

Dec. 24, 1997 [JP] Japan ................................. 9-366350

[51] Int. Cl.[7] ........................................................ F27D 3/00
[52] U.S. Cl. ............................. 432/11; 432/152; 432/205
[58] Field of Search ................................. 432/5, 11, 152, 432/241, 205; 219/390, 405, 411; 392/416, 418; 118/724, 725

[56] References Cited

U.S. PATENT DOCUMENTS 5,407,350  4/1995  Iwabuchi et al. ........................ 432/11

*Primary Examiner*—John A. Jeffery
*Assistant Examiner*—Jiping Lu
*Attorney, Agent, or Firm*—Snider & Associates; Ronald R. Snider

[57] ABSTRACT

An apparatus for manufacturing a semiconductor material includes a load-lock chamber which can contain a cassette for holding at least one wafer for taking the wafer into or out of the apparatus, a process furnace for conducting a treatment to the wafer, and a transfer chamber for transferring the wafer between the load-lock chamber and the process furnace, wherein the apparatus further includes a pressure detector for detecting a pressure difference between in the process furnace and in the transfer chamber, and a gas flow controller for controlling a flow rate of a gas flow supplied to the transfer chamber in accordance with results of detection by the pressure detector.

2 Claims, 3 Drawing Sheets

APPARATUS FOR MANUFACTURING A SEMICONDUCTOR MATERIAL

RELATED APPLICATION

This application claims the priority of Japanese Patent application No. 9-366350 filed on Dec. 24, 1997, which is incorporated herein by reference.

BACKGROUND OF THE INVENTION

1. Field of the Invention

This invention relates in general to an apparatus for manufacturing a semiconductor material, and more particularly to an apparatus for manufacturing a semiconductor material which can keep a pressure difference between in a process furnace and in a transfer chamber to be small.

2. Related Art

A single wafer apparatus for manufacturing a semiconductor material wherein wafers are processed one by one, such as for a thermal process or a vapor phase growth of a layer on a wafer, includes a process furnace for conducting the above processes and so on to a semiconductor substrate or a wafer, a load-lock chamber for taking the wafer into or out of the apparatus, and a transfer chamber for transferring the wafer from the load-lock chamber to the process furnace or from the process furnace to the load-lock chamber.

FIG. 2 shows a conventional single wafer apparatus for manufacturing a semiconductor material. In this apparatus, a process furnace 1 is connected to a transfer chamber 2 through a gate valve 4, and the transfer chamber 2 is connected to a load-lock chamber 3 through a gate valve 5.

The load-lock chamber 3, which is provided for taking a wafer 6 into or out of the apparatus, can contain one cassette which can hold up to 25 wafers of 8 inches for example. The atmosphere of the load-lock chamber 3 is usually kept in nitrogen. The nitrogen gas is supplied into the load-lock chamber 3 from an introducing pipe 21 at a flow rate of 15 liters/min.

The transfer chamber 2 is a chamber for transferring the wafer 6 from the load-lock chamber 3 to the process furnace 1, and provided with a transfer instrument for transferring the wafer 6, though not shown in FIG. 2. The transfer instrument takes the wafer 6 one by one from the cassette 10 in the load-lock chamber 3 and transfers the wafer 6 into the transfer chamber 2 where the wafer 6 is kept still until the process for the other wafer in the process furnace 1 is completed. When the process for the other wafer is completed in the process furnace 1, the gate valve 4 is opened and the wafer 6 in the transfer chamber 2 is transferred to the process furnace 1. The atmosphere in the transfer chamber 2 is also kept in nitrogen. The flow rate of nitrogen gas supplied from an introducing pipe 22 to the transfer chamber 2 is kept at 15 liters /min. by a restrictor 7. The nitrogen gas is then discharged to the air through an exhaustion pipe 14 provided with a butterfly valve 13.

The process furnace 1 is a furnace for conducting an aimed process to the wafer 6. If the apparatus is a vapor phase growth apparatus, for example, a vapor phase epitaxial growth is conducted in the process furnace 1. In this case, the atmosphere in the process furnace 1 is always kept in hydrogen by supplying hydrogen from an introducing pipe 23 at a flow rate of 40–60 liters/min., and etching gas, source gas, dopant gas and so on are occasionally supplied into the process furnace 1 with hydrogen at 700–1200° C. The gases supplied into the process furnace 1 are flown through an exhaustion pipe 19 to a gas scrubber 18, where the etching gas, the source gas, the dopant gas and so on are completely removed from the exhaustion gas and then the hydrogen gas is discharged into the air.

In the above described apparatus, in order to avoid escaping of the process gas in the process furnace 1 to the transfer chamber 2 and the load-lock chamber 3, relations among the pressures P's in the chambers and the furnace are preferably:

P(process furnace 1)<P(transfer chamber 2)<P(load-lock chamber 3)

Further, in order to avoid generation of rapid flows from one chamber or furnace to the other due to the pressure differences therebetween, bypass lines 11 and 15 and auto-valves 12 and 16 are provided so that the gate valves are set to be opened after the pressures in the chambers are even by opening the auto-valves just before the gate valves open. Additionally, manometers 25 and 26 are provided for measuring the pressures in the transfer chamber 2 and the process furnace 1, which are kept at 740–760 torr respectively.

According to the apparatus, the wafer 6 is processed in a following way. First, a door of the load-lock chamber 3 is opened, a cassette 10 holding the wafers 6 is set in the load-lock chamber 3, and then the atmosphere in the load-lock chamber 3 is substituted to nitrogen by vacuuming. After that, no pressure difference between the load-lock chamber 3 and the transfer chamber 2 are made by the bypass line 11 beforehand, and then the gate valve 5 of the load-lock chamber 3 is opened, and one of the wafers 6 is transferred to the transfer chamber 2 by the transfer instrument in the transfer chamber 2, and then the gate valve 5 is closed. Then, after the pressure difference between in the transfer chamber 2 and the process furnace 1 is made small by the bypass line 15 beforehand, and then the gate valve 4 is opened, and the wafer 6 is transferred to the process furnace 1. Then, the gate valve 4 is closed. After a predetermined process for the wafer 6 is conducted in the process furnace 1, the wafer 6 goes back to the load-lock chamber 3 from the process furnace 1 by returning the reverse pass with a similar sequence.

However, according to the conventional apparatus, there are problems described below. When the wafer 6 is transferred from the transfer chamber 2 to the process furnace 1, no pressure difference between in the process furnace 1 and in the transfer chamber 2 is made by opening the auto-valve 16 of the bypass line 15 before opening the gate valve 4, however, if the pressure difference is large, there generates a rapid gas flow in the bypass line 15 when the auto-valve 16 of the bypass line 15 opens due to the large pressure difference.

The rapid gas flow flows into the process furnace 1 if the pressure in the transfer chamber 2 is higher than that in the process furnace 1, and flows into the transfer chamber 2 if the pressure in the process furnace 1 is higher. Consequently, particles existing in the process furnace 1 or in the transfer chamber 2 are blown up thereby. The gate valve 4 is opened few seconds after the auto-valve 16 is opened, however, the blowing up of the particles continues for dozens of seconds, consequently there may occur contamination of the wafer 6 by the particles. The wafer 6 may be contaminated by the particles of about 80 particles/wafer if the pressure difference between in the process furnace 1 and in the transfer chamber 2 is 7 torr or more, for example.

Further, in the process furnace 1, the gas flow from the bypass line 15 does not flow directly forward the front surface side of the wafer 6 since the end of the bypass line 15 is provided below the back side of a susceptor 17 in the process furnace 1, however, the gas flow may reach to the front surface side of the wafer 6 from the back side surface of the susceptor 17 if the gas flow is rapid, and the gas flow may blow up polysilicon deposited on the front surface side of the wafer 6 as particles.

Further, a pipe of the bypass line 15 is relatively narrow, and it takes some time to make the pressures in the chamber or the furnace same, even if the auto-valve 16 of the bypass line 15 is opened, therefore the pressures in the chamber and the furnace do not become the same before the gate valve 4 is opened, if the pressures are widely different between in the process furnace 1 and the transfer chamber 2. Consequently, there may generate a rapid gas flow which flows through the gate valve 4 just when it is opened, and it may cause blowing up of particles.

The pressure difference between in the process furnace 1 and the transfer chamber 2 is caused by mainly following 2 reasons.

The first reason is an existence of the pressure difference between in the exhaustion pipes 19 and 14 respectively provided to the process furnace 1 and the transfer chamber 2. The exhaustion pipe 14 provided to the transfer chamber 2 is open directly to the air through the butterfly valve 13. On the other hand, the exhaustion pipe 19 provided to the process furnace 1 is open to the air through the gas scrubber 18. Therefore, the pressure in the exhaustion pipe 19 of the process furnace 1 is generally lower than that in the exhaustion pipe 13 of the transfer chamber 2 by 7 torr or more.

The second reason is a choking of the exhaustion pipe 19 provided to the process furnace 1. Products generated by a reaction between the non reacted source gas and the other gases are deposited in the exhaustion pipe 19, which may choke the pipe. Consequently, the pressure in the process furnace 1 connected with the exhaustion pipe 19 gradually increases, and finally becomes higher than the pressure in the transfer chamber 2 connected with the exhaustion pipe 14 by 2 torr or more.

Thus, contamination of the wafer 6 occurs due to the blowing up of particles when the pressure difference between in the process furnace 1 and the transfer chamber 2 becomes large. Further, if the pressure in the process furnace 1 is higher than that in the transfer chamber 2, the etching gas or residual source gas in the process furnace 1 flows into the transfer chamber 2. Such corrosive gases may corrode the transfer instrument in the transfer chamber 2.

BRIEF SUMMARY OF THE INVENTION

The object of the present invention is to provide an apparatus for manufacturing a semiconductor material wherein particles attachment to a semiconductor substrate during transferring and defects in devices are avoided by reducing the pressure difference between in the process furnace and the transfer chamber.

The present invention provides an apparatus for manufacturing a semiconductor material which includes a load-lock chamber which can contain a cassette for holding at least one semiconductor substrate for taking the semiconductor substrate into or out of the apparatus, a process furnace for conducting a treatment to the semiconductor substrate, and a transfer chamber connected to the load-lock chamber and the process furnace intervened by a gate valve for each for transferring the semiconductor substrate between the load-lock chamber and the process furnace, wherein further including a pressure detector for detecting a pressure difference between in the process furnace and in the transfer chamber, and a gas flow controller for controlling a flow rate of a gas flow supplied to the transfer chamber in order that a pressure difference between in the process furnace and the transfer chamber is kept to be at a predetermined value or less in accordance with results of detection by the pressure detector.

Preferably, the pressure difference between in the process furnace and in the transfer chamber is controlled to satisfy the following conditions:

$$-2 \text{ torr} \leq (P(\text{transfer chamber}) - P(\text{process furnace})) \leq 6 \text{ torr}$$

DETAILED DESCRIPTION OF THE INVENTION

Figure 1:
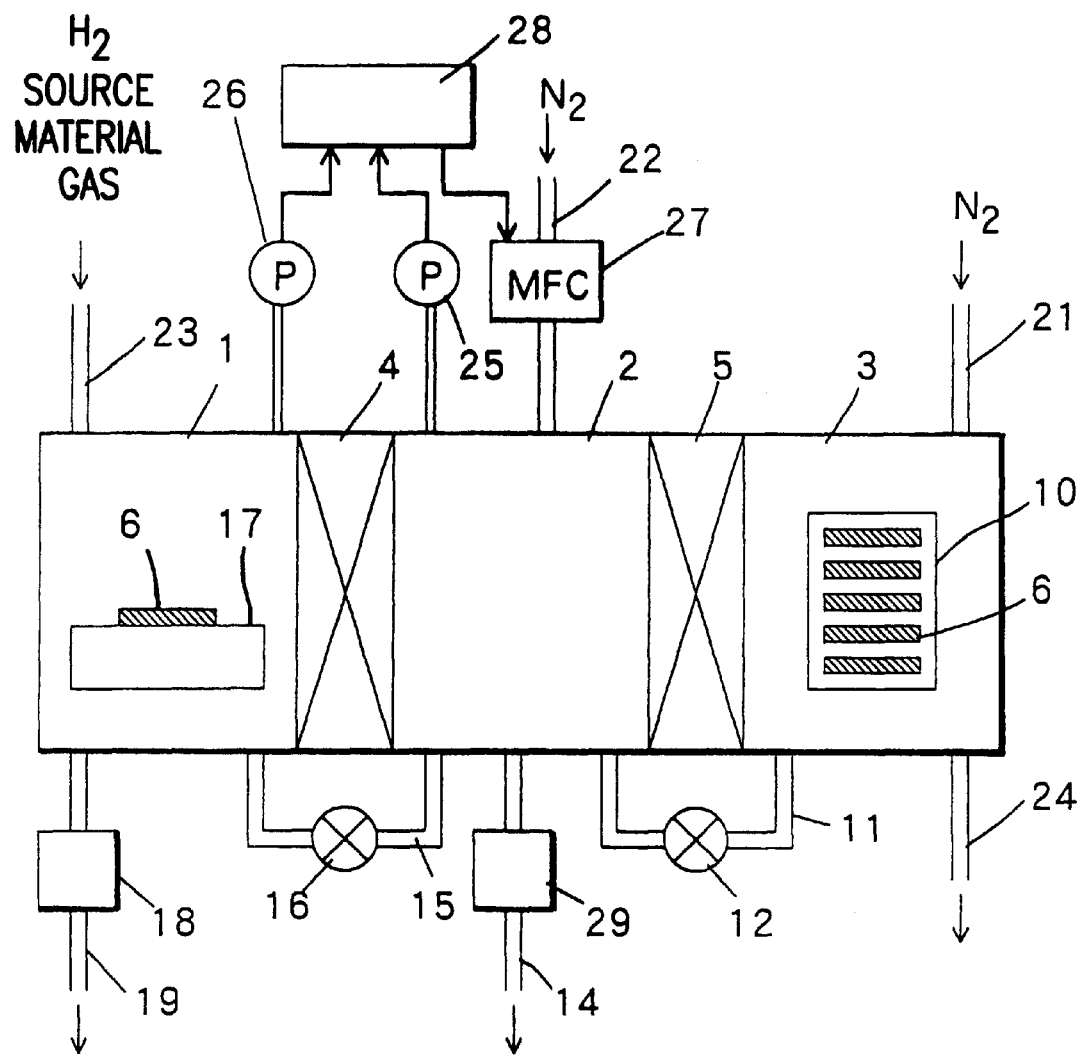
FIG. 1 is a schematic illustration showing an apparatus for manufacturing a semiconductor material according to the invention.
Figure 2:
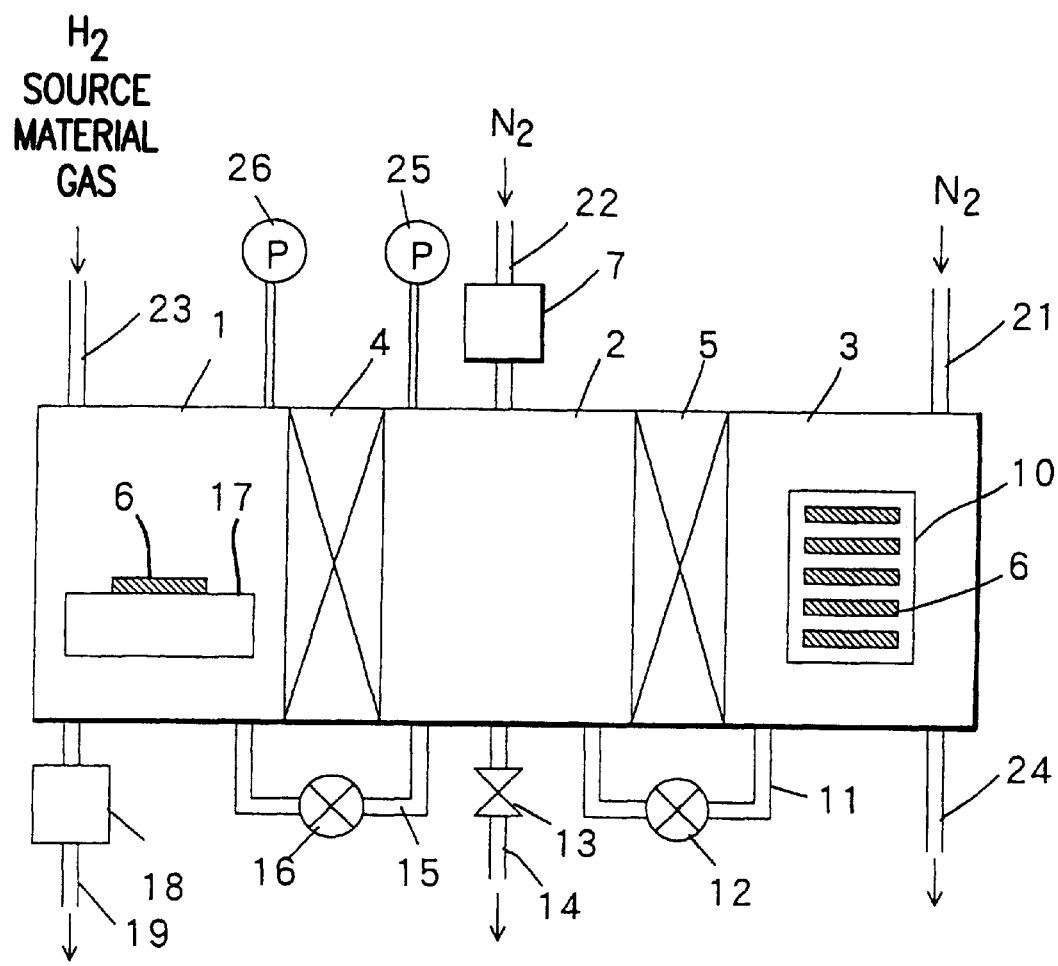
FIG. 2 is a schematic illustration showing a conventional apparatus for manufacturing a semiconductor material.

FIG. 1 shows a single wafer apparatus for manufacturing a semiconductor material as an embodiment according to the invention. This apparatus includes a transfer system for transferring a semiconductor substrate, a process furnace, a gas flow control system, a pressure control system, an apparatus control system, a vacuum exhaust system, etc. The basic structure of the apparatus is the same as that shown in FIG. 2 except the gas flow control system and the pressure control system.

In this apparatus, a nitrogen introducing pipe 22 of the transfer chamber 2 is provided with a MFC (Mass Flow Controller) 27, through which nitrogen is supplied to the transfer chamber 2 at typically 15 liters /min. Further, an exhaustion pipe 14 of the transfer chamber 2 is provided with a throttle valve 29, and there is provided a controller 28 for controlling the aperture of the MFC 27 in accordance with results of a measurement of manometers 26 and 25 which measure pressures in the process furnace 1 and in the transfer chamber 2 respectively. These are the consistents of the gas flow control system.

Next, operation of the pressure control system is described below.

Concerning about a pressure balance between the transfer chamber 2 and the load-lock chamber 3, the pressure in the load-lock chamber 3 is preferably slightly higher than or equal to that in the transfer chamber 2 just before the gate valve 5 is opened. Since the wafer 6 waits for treatment in the load-lock chamber 3, particles may be attached to the wafer 6 if the inside of the load-lock chamber 3 is contaminated with particles, resulting in crystal defects when an epitaxial layer is grown on the wafer 6. Therefore, it is especially necessary to pay attention to prevent particles coming into the load-lock chamber 3, since the wafer 6 stays much longer time in the load-lock chamber 3 than in the transfer chamber 2.

On the other hand, possibility of contamination by particles is relatively high in the transfer chamber 2 near to the process furnace 1 compared with that in the load-lock chamber 3. Further, there generates a rapid gas flow from the load-lock chamber 3 to the transfer chamber 2 through the gate valve 5 when the gate valve 5 is opened if the pressure in the load-lock chamber 3 is higher by 10 torr or more than that in the transfer chamber 2. In this case, particles are blown up in the transfer chamber 2 if the inside of the transfer chamber 2 is contaminated by particles, resulting in penetration of the particles into the load-lock chamber 3.

For preventing particle contamination, in the apparatus according to the embodiment of the invention, the load-lock chamber 3 and the transfer chamber 2 are both purged by nitrogen. And the exhaust gas of nitrogen purge in the load-lock chamber 3 flows into the transfer chamber 2 through the bypass line 11 in which the auto-valve 12 is normally kept open, while the exhaust gas from the transfer chamber 2 is discharged into the air through the exhaustion pipe 14. Consequently, the pressure in the transfer chamber 2 is kept at the atmospheric pressure, while the pressure in the load-lock chamber 3 is automatically kept higher than that in the transfer chamber 2 by the pressure of nitrogen purge.

When a door of the load-lock chamber 3 is opened to take the cassette 10 holding the wafers 6 into or out of the load-lock chamber 3, the air penetrates into the load-lock chamber 3. Therefore, connection between the load-lock chamber 3 and the transfer chamber 2 is cut off before opening the door of the load-lock chamber 3 which is to be open to the air, and the connection is restored after the cassette 10 is taken into or out of the load-lock chamber 3 and the inside of the load-lock chamber 3 is purged by nitrogen.

To be in more detail, first, the valve 12 of the bypass line 11 which is normally open is closed, then the door of the load-lock chamber 3 is opened and the cassette 10 is taken into or out of the load-lock chamber 3. In order to purge the air penetrated into the load-lock chamber 3 while opening the door, a pressure of the load-lock chamber 3 is reduced by a vacuum pump which is not shown in FIG. 1 through the exhaustion pipe 24 for 10 minutes to 10 torr. After enough vacuum reduction of the air from the load-lock chamber 3, the vacuum pump is stopped and the pressure in the load-lock chamber 3 is restored to be at the atmospheric pressure by introducing nitrogen. When the pressure in the load-lock chamber 3 is restored to be at the atmospheric pressure, the auto-valve 12 of the bypass line 11 is opened and the usual state is restored.

Respecting operation between the transfer chamber 2 and the process furnace 1, when the wafer 6 is transferred from the transfer chamber 2 to the process furnace 1, the auto-valve 16 of the bypass line 15 is opened five seconds before the gate valve 4 is opened and is closed at the same time as the gate valve 4 is closed. The reason why the auto-valve 16 of the bypass line 15 is opened five seconds before the gate valve 4 is opened is to make the pressures in the transfer chamber 2 and in the process furnace 1 be the same before the gate valve 4 is opened, as described before.

In this apparatus, it makes possible to control the pressure in the transfer chamber 2 for a flow rate of nitrogen supplied through the MFC 27 by installing the throttle 29 to the exhaustion pipe 14 of the transfer chamber 2. In more specific, the flow rate of nitrogen supplied through the MFC 27 is kept at typically 15 liters /min. by adjusting an opening level of the throttle 29 of the exhaustion pipe 14.

Further, the pressure in the process furnace 1 is always monitored by the controller 28 through the manometer 26, and a difference of the pressure in the transfer chamber 2 and in the process furnace 1 is kept at a predetermined value or less by controlling the flow rate of nitrogen automatically. In more specific, the pressures P25 and P26 in the transfer chamber 2 and the process furnace 1 are measured respectively, and the pressure difference (P25−P26) is calculated. Then, a difference of the measured pressure difference to a target pressure difference, determined so that the pressure in the transfer chamber 2 is higher (for example, P25−P26=2 torr), is adjusted by controlling the nitrogen gas flow rate from the MFC 27.

Thus, according to the invention, an apparatus for manufacturing a semiconductor material is provided wherein it is possible to reduce particles attached to the wafer while transferring and to restrict generation of defects in the products.

EXAMPLES

In the apparatus shown in FIG. 1, it is measured a relation between the pressure difference (P25−P26) in the transfer chamber 2 and in the process furnace 1 before the auto-valve 16 and the gate valve 4 are opened and number of particles attached to the wafer 6.

Figure 3:
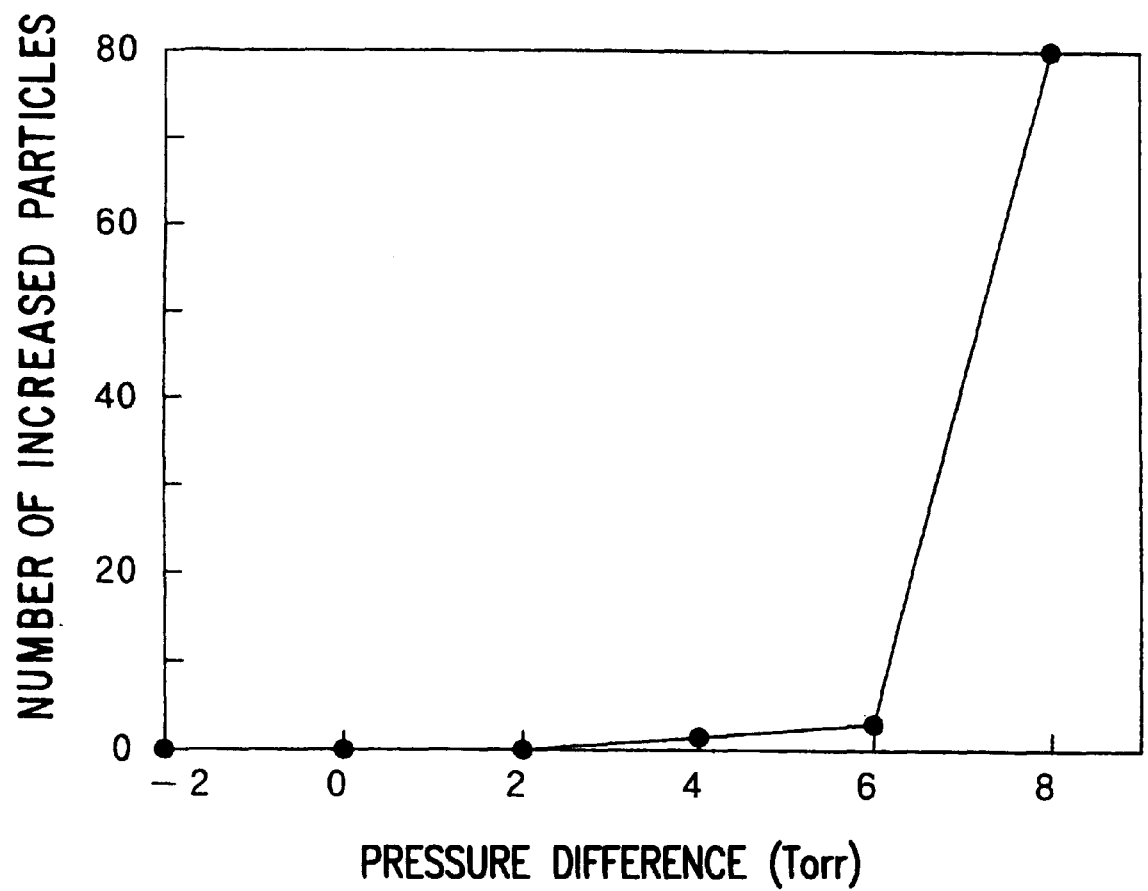
FIG. 3 is a graph showing relation between number of increased particles and the pressure difference between in the transfer chamber and in the process furnace.

The wafer 6 of which number of particles attached to is already measured is transferred from load-lock chamber 3 to the process furnace 1 through the transfer chamber 2, and the wafer 6 is returned to the load-lock chamber 3 from the process furnace 1 without conducting any treatment. In the above sequence, the pressure in the process furnace 1 is set at 760 torr, the process furnace 1 is heated to 700° C. in the atmosphere of hydrogen. Number of particles attached to the wafer 6 which has been returned to the load-lock chamber 3 is measured for various conditions of the pressure in the transfer chamber 2. The pressure condition in the transfer chamber 2 is changed by changing a flow rate of nitrogen supplied from the MFC 27. Then, number of increased particles of 1.6 nm or more compared with the initial number is counted. FIG. 3 shows a relation between: the pressure difference (P25−P26) (torr) between in the process furnace 1 and in the transfer chamber 2 which is represented by the relative pressure of the transfer chamber 2 to the process furnace 1; and number of the increased particles. According to the results of the measurements, the particle number is extremely increased compared with the initial number if the the pressure in the transfer chamber 2 is higher by 6 torr than that in the process furnace 1. On the other hand, increase of particles attached to the wafer 6 during the sequence is almost suppressed if the relative pressure of the transfer chamber 2 to the process furnace 1 is kept within −2 to 6 torr.

What is claimed is:

1. A method for manufacturing a semiconductor substrate using an apparatus for manufacturing a semiconductor material which comprises a load-lock chamber containing a cassette for holding at least one semiconductor substrate for taking the semiconductor substrate into or out of the apparatus, a process furnace for conducting a treatment to the semiconductor substrate, and a transfer chamber connected to the load-lock chamber and the process furnace intervened by a gate valve for each for transferring the semiconductor substrate between the load-lock chamber and the process furnace:

wherein the apparatus for manufacturing a semiconductor material further comprises a pressure detector for detecting a pressure difference between in the process furnace and in the transfer chamber, and a gas flow controller for controlling a flow rate of a gas flow supplied to the transfer chamber in accordance with results of detection by the pressure detector; and wherein the pressure difference between in the process furnace and in the transfer chamber is controlled to satisfy the following conditions:

$-2 \text{ torr} \leq (P(\text{transfer chamber}) - P(\text{process furnace})) \leq 6 \text{ torr}.$ 2. A method for manufacturing a semiconductor substrate according to the claim 1 wherein the apparatus for manufacturing a semiconductor material is a vapor phase growth apparatus.

* * * * *